US009941683B2

(12) United States Patent
Olivas et al.

(10) Patent No.: US 9,941,683 B2
(45) Date of Patent: Apr. 10, 2018

(54) DEVICE FOR PROTECTING ELECTRICAL NETWORKS

(71) Applicant: WIN MS, Orsay (FR)

(72) Inventors: Marc Olivas, Palaiseau (FR); Arnaud Peltier, Gometz la Ville (FR)

(73) Assignee: WIN MS, Orsay (FR)

( * ) Notice: Subject to any disclaimer, the term of this patent is extended or adjusted under 35 U.S.C. 154(b) by 146 days.

(21) Appl. No.: 14/777,998

(22) PCT Filed: Mar. 18, 2014

(86) PCT No.: PCT/EP2014/055379
§ 371 (c)(1),
(2) Date: Sep. 17, 2015

(87) PCT Pub. No.: WO2014/147056
PCT Pub. Date: Sep. 25, 2014

(65) Prior Publication Data
US 2016/0276820 A1    Sep. 22, 2016

(30) Foreign Application Priority Data

Mar. 18, 2013 (FR) ..................... 13 52376

(51) Int. Cl.
| | |
|---|---|
| *H02H 7/00* | (2006.01) |
| *H02H 1/00* | (2006.01) |
| *H02H 3/17* | (2006.01) |
| *H02H 3/40* | (2006.01) |
| *H01H 9/54* | (2006.01) |

(Continued)

(52) U.S. Cl.
CPC ............ *H02H 1/0007* (2013.01); *H01H 9/54* (2013.01); *H02H 1/003* (2013.01); *H02H 1/0061* (2013.01); *H02H 1/0092* (2013.01); *H02H 3/17* (2013.01); *H02H 3/40* (2013.01); *H02H 7/26* (2013.01); *G01R 31/11* (2013.01); *H02H 7/261* (2013.01)

(58) Field of Classification Search
USPC ...................................... 361/62–69
See application file for complete search history.

(56) References Cited

U.S. PATENT DOCUMENTS

| | | |
|---|---|---|
| 2,602,841 A | 7/1952 | Applegate et al. |
| 4,109,117 A | 8/1978 | Wrench, Jr. et al. |

(Continued)

FOREIGN PATENT DOCUMENTS

| | | |
|---|---|---|
| CN | 102326089 A | 1/2012 |
| EP | 2 221 626 A1 | 8/2010 |

(Continued)

*Primary Examiner* — Danny Nguyen
(74) *Attorney, Agent, or Firm* — Baker & Hostetler LLP

(57) ABSTRACT

The device comprises at least a first part intended to detect an electrical fault occurring in a network and a second part comprising at least one switch connecting the network to a power supply source, the first part comprising at least one reflectometry detection system capable of being coupled with the network, the system detecting and analyzing the impedance changes occurring in the network, a signal being sent by the system to trigger the opening of the switch when a detected impedance change is considered by the system to be an electrical fault.

15 Claims, 2 Drawing Sheets

(51) Int. Cl.
  *H02H 7/26* (2006.01)
  *G01R 31/11* (2006.01)

(56) References Cited

U.S. PATENT DOCUMENTS

| 5,381,348 A | 1/1995 | Ernst et al. |
| 2014/0104738 A1* | 4/2014 | Schweitzer, III ........ H02H 3/08 361/87 |

FOREIGN PATENT DOCUMENTS

| JP | 2004-074924 A | 11/2004 |
| WO | 2010/043602 A1 | 4/2010 |

* cited by examiner

DEVICE FOR PROTECTING ELECTRICAL NETWORKS

CROSS-REFERENCE TO RELATED APPLICATIONS

This application is a National Stage of International patent application PCT/EP2014/055379, filed on Mar. 18, 2014, which claims priority to foreign French patent application No. FR 1352376, filed on Mar. 18, 2013, the disclosures of which are incorporated by reference in their entirety.

FIELD OF THE INVENTION

The subject-matter of the present invention is a device for protecting electrical networks. It applies to the protection of all types of electrical networks regardless of their nature, whether they are intended for power supply or data transfer.

BACKGROUND OF THE INVENTION

The protection of electrical installations of any type is fundamental to the safety of persons and property. In fact, an electrical fault frequently causes a fire, often with disastrous consequences. An electrical fault can also cause an electrification of sensitive areas or, more dramatically, the electrocution of persons.

Electrical protection applies to all types of electrical installations. This may notably include the electrical protection of buildings, industrial sites, aircraft and automobiles, for example. This may also notably include electrical protection on new electrical production infrastructures such as wind farms or arrays of photovoltaic panels. Other infrastructures also require electrical protection, for example electric vehicle charging stations.

In many cases, the effects produced by electrical faults are worsened by the lack of responsiveness of the power supply shut-off units. In fact, when electrical faults occur, there are still many situations in which the power supply shut-off unit is activated too late. Fault detection time is a very important parameter in the protection chain.

The shorter the time of response to the occurrence of an electrical fault, the greater the chances of preventing or at least limiting its effect.

Solutions are known for securing electrical installations. These solutions are essentially based on the analysis of electrical variables such as the current/voltage relationship. They have a plurality of disadvantages, these disadvantages being dependent on the application type.

A first disadvantage is the lack of responsiveness. Devices today represent a compromise between the quality of detection and the false alarm rate, some protection devices being able to allow some fifteen electric arcs to pass before taking the decision to open the circuit.

The response times of many existing systems are therefore too long. In particular, the diagnosis time is prolonged by the fact of having intermittent serial or parallel arc faults, since a plurality of iterations are required before taking the decision to secure a line.

For some applications, electrical networks have other constraints, notably as in the case of cable networks in airplanes. An avionic network requires a compact and lightweight redundant protection system, offering maximum reliability. Solutions exist for aeronautics, but the fact of making an airplane more and more electrical and the constraint of a protection solution per line, and therefore per load, result in increasingly bulky and therefore increasingly heavy electrical cores, notably due to the current sensors. These solutions are therefore not entirely satisfactory.

Cable networks inside motor vehicles have other requirements with regard to their protection. Protection systems in motor vehicles are currently limited to fuses. A new constraint in this field is notably due to the appearance of battery packs that are highly sensitive to short circuits with a risk of explosion. Voltage levels also tend to increase with a greater probability of having electric arc phenomena or intermittent faults causing serious consequences.

Other inherent characteristics of electrical installations require specific protection devices. In particular, the same device is not suitable for two alternating-current networks having different frequencies, or a direct-current network. Nor is a device for a direct-current network suitable for an alternating-current network.

Current solutions do not therefore allow the use of standard protection devices suitable for all applications, or at least the use of devices having a similar structure for all these applications. In economic terms, this lack of standardization does not enable production cost optimization.

SUMMARY OF THE INVENTION

One object of the invention is notably to overcome the aforementioned disadvantages. To this end, the subject-matter of the invention is a device for protecting electrical networks, the device comprising at least a first part intended to detect an electrical fault occurring in a network and a second part comprising at least one switch connecting said network to a power supply source, the first part comprising at least one reflectometry detection system capable of being coupled with the electrical network, said system detecting and analyzing the impedance changes occurring in the electrical network, a signal being sent by said system to trigger the opening of the switch when a detected impedance change exceeds a given threshold, notably being able to characterize a fault.

In one particular embodiment, a detection system comprises at least:
  means for coupling with an electrical network;
  an injection unit generating a high-frequency electrical signal, said signal being injected into said network via the coupling means;
  a receiving unit capable of receiving a return signal from an injected signal, via the coupling means, said unit digitizing the received signals;
  a control and data processing unit connected to at least the receiving unit, said control and processing unit analyzing the digitized data supplied by the receiving unit;
  communication means connected to the control and processing unit, capable of transmitting control information to at least the second part.

The first part comprises, for example, a group of reflectometry detection systems capable of being coupled at a plurality of locations of an electrical network.

The network comprising at least one line, a detection system is, for example, coupled with each line end.

The network being made up of a plurality of segments (AB, AC, AD), an i-order segment is, for example, seen by a number $n_i$ of detection systems.

The device furthermore comprises, for example, means for measuring an electrical variable within the network, an opening command being sent to the switch when the measurement of this variable exceeds a given threshold, the electrical variable being able to be the current.

The coupling means advantageously perform, for example, a directive coupling by orienting the signal injected into the line in a given direction.

In one particular embodiment, at least one detection system is programmed to detect impedance changes in a given line area.

The signal sent to trigger the opening of a switch being a coded signal, the coded signal is carried by the sensor signal injected by a detection system.

The given detection threshold is, for example, programmable.

In a different possible embodiment, at least the injection unit, the receiving unit and the control and data processing unit are shared among a plurality of lines, one or more multiplexers being inserted between the injection and receiving units and the coupling units belonging to each line.

The device can advantageously be capable of delivering line diagnosis information on the basis of detections of impedance variation or speed variation of a signal injected by the reflectometry detection system.

The network is, for example, a telecommunication network.

In one advantageous embodiment, the detection system of the device implements a multi-carrier reflectometry method, for example MCTDR.

BRIEF DESCRIPTION OF THE DRAWINGS

Other characteristics and advantages of the invention will become evident from the description which follows, given with reference to the attached drawings, in which.

DETAILED DESCRIPTION

Figure 1:
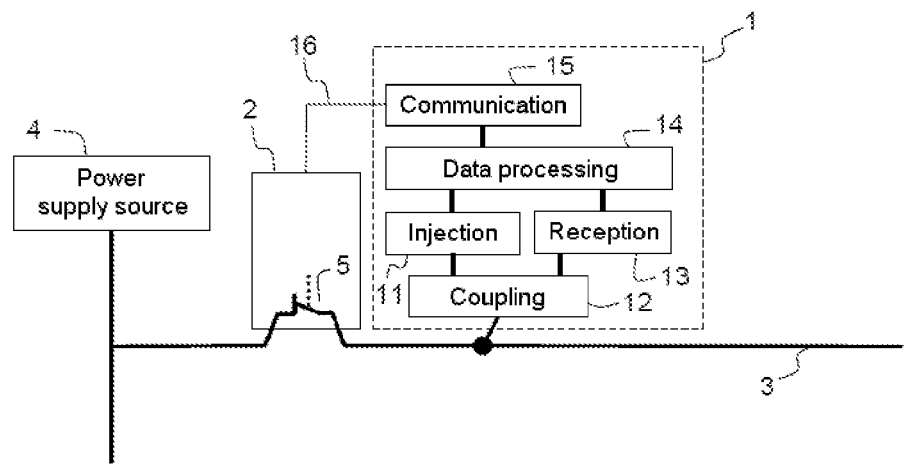
FIG. 1 shows one possible embodiment of a device according to the invention.

FIG. 1 shows a synoptic view of a possible embodiment of a device according to the invention. A device according to the invention comprises at least two parts: a first part 1 intended to detect and locate faults on one or more electrical lines 3 and a second part 2 made up of at least one controllable switch or contactor 5. This switch may be electromechanical or electronic, based on transistors or thyristors, for example. This switch is connected at the input to a power supply source 4 and is connected at the output to an electrical network 3. Conversely, the switch may be connected at the output to a power supply source. This enables account to be taken notably of the case of battery-powered systems, where either the battery powers the motor or the motor powers the battery, which is then charging.

The first part of the device is made up of at least one fault detection system 1 operating according to the reflectometry principle.

This principle is similar to that of the radar. An electrical signal, generally a high-frequency or broadband signal, is injected at one or more locations of a cable network on which a fault is likely to be detected. The signal propagates over the network and returns a part of its energy when it encounters an electrical discontinuity, i.e. an impedance change. In a simple case, the signal propagates along a two-wire power supply line, two conductors at least being necessary for its propagation. The invention applies to all other types of cable including one or more wires, in particular three-wire cables, coaxial cables and cables referenced to a ground plane.

An electrical discontinuity may result from a fault. The analysis of the signals returned to the injection point allows information relating to the presence, nature and location of these discontinuities, i.e. possible faults, to be inferred therefrom.

The system 1 used in a device according to the invention therefore comprises units enabling the implementation of this reflectometry detection and location principle.

It therefore comprises an injection unit 11 and coupling means 12. The injection unit comprises notably a frequency generator delivering a voltage which forms the injection signal, also referred to as the sensor signal. The frequency generator is, for example, programmable.

The injection unit generates an injection signal which is injected into a point of the network 3 by the coupling means 12. For this purpose, the coupling means are coupled with a point of the network, this point being the input point of the injection signal. The electrical line onto which the system is coupled being two-wire, one connection is established at a first point of a conductor and the other connection is established at a second point on the other conductor, facing the first point. In a multi-conductor application with a ground plane, one coupling can be implemented through connection at one point of a conductor and the other connection to the ground plane.

The function of the coupling means is notably:

to inject the sensor signal between two conductors of the line being monitored;

to receive the sensor signal between two conductors of the line being monitored;

Their function may also be:

to protect the system for detecting the native signal of the line;

to protect the system against aggressions linked to the environment (lightning, etc.);

to orient the sensor signal toward the line being monitored, said line being able to constitute part of a network formed by a plurality of lines, a directive coupling is then involved.

The reflectometry detection system 1 also comprises a receiving unit 13 capable of receiving the signals returned by the discontinuities encountered by the transmitted injected signal. These returned signals are transmitted to the receiving unit via the coupling means 12. The receiving unit notably comprises adapted filters, low-noise amplifiers and analog-digital converters.

The system also comprises an intelligent unit 14. This unit 14 is connected to the injection unit 11 and to the receiving unit 13. It notably enables the control of the programmable frequency generator of the injection unit. It receives the digitized received signals supplied by the receiving unit 13. It notably performs the processing of these digital data in order to confirm or otherwise the presence of a fault and also its location.

The system 1 furthermore comprises communication means 15 allowing it to communicate with the switch 5 or toward other systems, a monitoring system, for example, notably in an embodiment with a plurality of switches. The communication means notably enable the intelligent unit to remotely control the switch 5, directly or via a monitoring system. If a fault is detected, the control unit may in fact send a control signal to the switch 5. On receiving this signal, the switch opens the power supply line. For this purpose, the switch 5 comprises the necessary interfaces enabling the opening of the circuit on the basis of a low-level control signal sent via the communication means 15. The communication line 16 between these communication means 15 and the switch 5 may be wireless. A secondary cable can also be used as a communication line. The communication system can also receive information from other units and thus enable the processing unit 14 to take account of external elements in the decision-making. This can advantageously be used when a component, for example a switch, on a protected line changes state. The processing unit then knows that this involves a normal event in the operation of the system and not a fault.

The reflectometry detection system 1 injects a signal into the network having a frequency spectrum that does not interfere with either the useful signals present on the line or the network cable environment, notably meeting the frequency requirements relating to EMC constraints. The repetition period of the injected signal must be sufficiently short to allow the system to detect a first fault that may potentially destroy an installation, therefore the repetition period may be less than 500 µs, or even shorter. For this purpose, the injected signal can advantageously be generated according to multi-carrier reflectometry methods, for example MCTDR (Multi-Carrier Time Domain Reflectometry) or other methods having the same frequency characteristics.

For bandwidth constraints of the lines 3 of the network, the signals use, for example, frequencies between 100 kHz and 200 MHz with an amplitude of less than one volt and a periodicity in the order of around one hundred nanoseconds.

In a preliminary phase, the reflectometry detection system is parameterized by determining a detection threshold. The detection threshold corresponds to a given voltage level. A fault is detected when a received signal, originating from the encounter of a discontinuity in the network, exceeds this threshold. This threshold may be variable.

Figure 2:
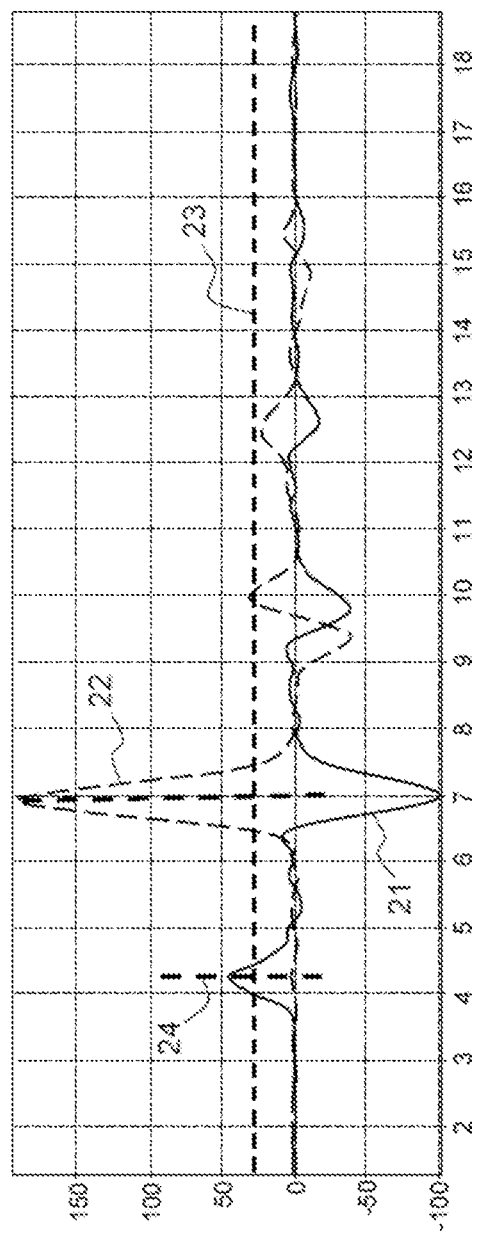
FIG. 2 shows an example of the operation of a detection threshold of a return signal received by a reflectometer used in a device according to the invention.

FIG. 2 shows an example of the operation of a threshold of this type. FIG. 2 shows the return signal of a Gaussian sensor signal, given by way of example, which is transmitted in an electrical line and considered here as the reference signature of this line, and also the return signal 22 resulting from the calculation of the difference between the continuous measurement and the signal 21. The reference is recorded by the system and placed in memory at a noteworthy time in the life of the system, for example:

on installation;
on first powering up;
on start-up of the system or subsystem;
under the control of an external unit;
periodically;
or automatically taking into account the variability of the state of the loads or interconnections that may affect the signature of the line and which would not be faults.

The voltage V of the signal is measured as a function of the time t. The transition from the time domain to a distance takes place on the basis of the knowledge of the propagation speed which is parameterized when the system is installed or is calculated automatically on the basis of a standard measurement. The origin 24 is defined as the coupling point between the wired diagnostic system and the line, this also being the zero distance, which can be determined automatically by the system or can be defined as a parameter on installation.

Whenever the values of the amplitude of the curve 22 exceed a threshold 23 (it is linear over the entire line length by way of example), a fault is considered to be present on the line. The round-trip propagation time of the signal furthermore allows the distance travelled to be determined and therefore the fault to be located. The distance is calculated between the origin and the first maximum value of the amplitude after having exceeded the threshold. Moreover, the threshold 23 is defined:

according to the line type in order to take account of the broadband characteristics of said line such as damping and attenuation;
according to the fault type (dead faults, non-dead faults); in fact according to the type of fault to be diagnosed, a plurality of thresholds can be defined for the same system with a plurality of alarm levels.

As soon as a fault is detected, a message is sent to the switch 5 via the communication means 15.

The faults that can be detected by means of the reflectometry detection system 1, faults corresponding to impedance changes in the electrical lines, are notably as follows:

short circuit;
open circuit;
parallel arcs;
serial arcs;
insulation fault;
partial discharge.

All these faults are likely to cause damage in electrical installations, in particular fires or destruction of electrical equipment. It must be noted that existing protection systems do not detect open circuits. An open circuit may be particularly dangerous since it can be the cause of an accidental electrification.

The invention advantageously enables a very short response time to be obtained when an electrical fault occurs. The time constants involved are in fact very low:

the period T of injection of the sensor signal into the network, T is in the order of the microsecond;
the round-trip time until the fault, more or less zero with regard to the propagation speed of the electrical signal and the distances involved;
the received signal processing time, less than one millisecond, this being the time that ultimately determines the overall response time;
the received signal transmission time, this also being negligible.

The duration Δt between the occurrence of a fault on the network and the power supply shut-off command to the switch 5 is therefore such that $$\Delta t < 1 \text{ ms.}$$

In order to detect overcurrents and overvoltages, in particular electrical overloads, a current or voltage sensor can be coupled with the reflectometry detection system 1. This sensor may comprise current digitization means, the digitized value then being transmitted to the intelligent unit 14 of the system 1.

The architecture of a device according to the invention depends notably on the complexity of the network to be secured. FIG. 1 shows a simple example where the device comprises a reflectometry detection system 1 and a switch 5.

Figure 3:
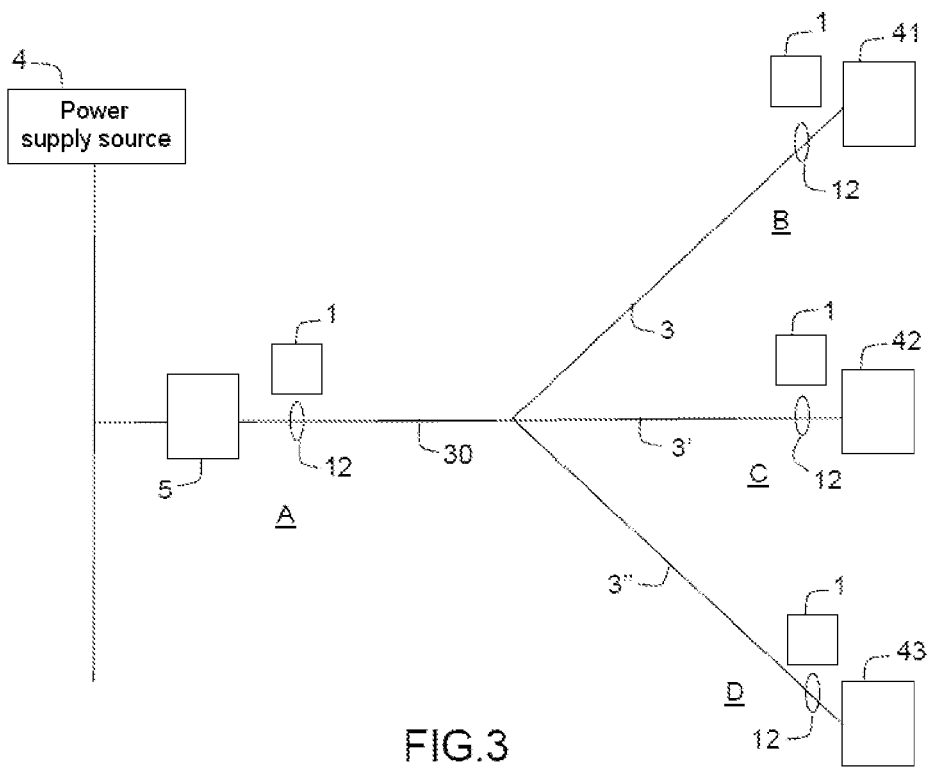
FIG. 3 shows an example of use of devices according to the invention in a network.

FIG. 3 shows an example embodiment where the device according to the invention comprises a switch 5, disposed at the input of the network to be secured, and a plurality of reflectometry detection systems. In this example, the network comprises a first two-wire line 30 which separates into three two-wire lines 3, 3', 3" forming three branches, each connecting an electrical device 41, 42, 43. A reflectometry detection system 1 is placed at the input of the first line 30. A detection system 1 is also coupled with the end of each line, in the electrical equipment. If a fault is detected on a line by one of the systems 1, said system transmits an opening command to the switch 5.

The detection systems 1 can advantageously be interconnected via a communication channel. The measurement information can then be sent to a master system which can use the measurements of the other systems. This may be useful notably for precisely locating a fault. In the example shown in FIG. 3, the detection system 1 placed at the network input on the first line 30 may play this role of master system. Information relating to a fault detected by a different system with its distance to this system notably allows the conclusion that the line concerned is the line coupled with the system, the fault being at the measured distance from the system.

The sensor signal can also be used to transmit the information, in particular the information relating to the fault and associated distance, this information being encoded on several bits. The architecture shown in FIG. 3 is an example of meshing of a network by devices according to the invention. It is possible to provide more elaborate meshing, notably for larger or more complex networks. However, the simple example shown in FIG. 3 illustrates the principle of a meshing of this type. A meshing can also be provided wherein each segment of the network is seen by a plurality of detection systems 1, a segment being a line comprised between two detection systems. In particular, a meshing can be implemented wherein each segment is seen by n detection systems, the number n being variable according to the segments. In other words, an i-order segment is seen by a number $n_i$ of detection systems. In the example shown in FIG. 3, the network comprises three segments AB, AC, AD, where A, B, C, D, are the locations of the detection systems on the first line 30, on the first branch 3, on the second branch 3' and on the third branch 3" respectively. Each segment is seen by the two detection systems 1 disposed at its ends, but also by the detection systems of the other segments via the node 40 from which the branches leave. The segment AB is thus seen by all the detection systems 1 of the network.

This notably offers the possibility of having a redundancy of the detection information and a removal of doubt with at least two independent sensors.

In the example application shown in FIG. 3, the device comprises a switch associated with detection systems 1 forming the mesh, the detection systems communicating with the switch. It is possible to place protection devices according to the invention in the place of each detection system 1, the device comprising a switch. This possibly allows the implementation of partial shut-offs of the network. This also allows the use of standard devices. Protection devices are thus networked to form the required meshing. The switch of the device is used or otherwise according to the segments.

A plurality of embodiments of a device according to the invention are possible. In a first embodiment, the first part and the second part can be disposed in the same housing. More particularly, in this case, the switch and the reflectometry detection system are placed in the same housing.

In a different embodiment, the components of the device according to the invention are distributed, as shown notably in FIGS. 1 and 4. In this latter case, the device comprises at least one switch to isolate a network, or a part of the network from its power supply source, and at least one reflectometry detection system communicating with the switch(es).

It is also possible to separate the coupling means 12 from the other components of the detection system 1. This embodiment is notably suitable for the protection of lines under high voltage. The coupling means are thus placed as close to the line as possible while distancing the rest of the detection system. The link between the coupling means and the detection system is established as a homogeneous and controlled impedance link, for example a pair of twisted wires or a 50Ω coaxial cable.

In a different embodiment, the coupling may be wireless.

The coupling may advantageously be directive as previously shown. In this case, the device detects faults in one direction only, this direction being predetermined. This coupling method is particularly suitable when a plurality of lines requiring protection are connected to a busbar, the power supply current flowing from the busbar to loads via the lines. The busbar having a low impedance compared with the lines, the sensor signal naturally moves toward the busbar. The directive coupling enables orientation of the sensor signal downstream, i.e. toward the loads. The directive coupling can be implemented in a plurality of ways. For example, a self-inductance can be interleaved upstream while acting on the frequency of the sensor signal in order to increase the upstream impedance.

A device according to the invention advantageously enables a detection of and rapid response to a plurality of types of fault, and even anticipation thereof.

The measurements originating from the reflectometer, in particular the impedance changes or propagation speed variation, can be used to produce a line diagnosis. The control and processing unit can thus be programmed to produce a diagnosis of this type, for example according to the line, threshold, event or signature parameters defined as characteristic of a line state. A device according to the invention may notably detect intermittent or "non-dead" faults that are characteristic, for example, of an ageing or local or general damage of the line or the load, which may nevertheless damage the installations or equipment.

A device according to the invention may be applied regardless of the nature of the network. In other words, it is independent from the nature of the network. It may be applied regardless of the transmitted power, regardless of the frequency, regardless of the voltage, whether the current is direct or alternating. In fact, the reflectometry method applied is independent from the nature of these networks.

The invention may also be applied to protect telecommunication networks or power supply networks where carrier currents flow. Advantageously, the reflectometry method does not interfere with the data transfer within the network provided that the suitable frequency of the sensor signal transmitted in the network or other methods to differentiate the signals are chosen.

Again advantageously, the device according to the invention can operate when the network is not powered up, unlike conventional current and voltage solutions which require the network to be supplied with power. This notably allows a network to be controlled before it is powered up.

The reflectometry detection system can advantageously transmit information on the location of an electrical fault. This information can then be used by maintenance services.

A device according to the invention can advantageously be integrated into existing protection devices. In other words, it can complement conventional devices by adding reflectometry detection systems to them, the latter being capable of triggering the opening of the circuit breakers or switches already installed. The information originating from the reflectometry-based sensor can then be used directly to trigger the opening of the circuit or to contribute with other parameters to the triggering decision-making.

A device according to the invention can advantageously be parameterized to protect one or more line areas. Detection parameters, in particular the sensitivity of the detection, can thus be defined according to the type of load or the line area. By way of example, in order to protect a load located at a given distance from the device, for example 10 meters, a detection is carried out over the area located between 9.5 meters and 10.5 meters. In this case, the processing means process only the impedance changes detected in the area to be protected.

In one alternative embodiment of a device according to the invention, the communication means 15, the processing means 14 or control and data processing unit, the injection unit 11 and the receiving unit 13 can be pooled, i.e. shared among a plurality of lines by inserting one or more multiplexers between the injection unit 11 and the receiving unit 13 and the coupling means 12 belonging to each line. In other words, coupling means 12 are assigned to each of the lines, the links between the coupling means and the injection and receiving units being provided by the multiplexer(s).

Each line is therefore protected by a monitoring that is carried out successively and periodically. A period T1 can thus be taken for a first line, and a period Tn for the $n^{th}$ line by ensuring that the duration $t_d$ of the smallest fault to be detected is such that:

$$T1+T2\ldots+Tn<t_d$$

thus ensuring that the fault is seen, regardless of the line on which it occurs.

The invention claimed is:

1. A device for protecting electrical networks, comprising:
   at least a first part intended to detect an electrical fault occurring in a network and a second part comprising at least one switch connecting said network to a power supply source, the first part comprising at least one reflectometry detection system capable of being coupled with the network, said reflectometry detection system configured to detect and analyze impedance changes occurring in the network, wherein a signal is sent by said system to trigger an opening of the at least one switch when a detected impedance change exceeds a given threshold, and wherein the first part includes a group of reflectometry detection systems couplable at a plurality of locations of an electrical network.

2. The device as claimed in claim 1, wherein the detection system comprises at least:
   means for coupling with the electrical network;
   an injection unit configured to generate a high-frequency electrical signal, said signal being injected into said network via the coupling means;
   a receiving unit capable of receiving a return signal from an injected signal, via the coupling means, said unit digitizing the received signals;
   a control and data processing unit connected to at least the receiving unit, said control and processing unit analyzing the digitized data supplied by the receiving unit;
   communication means connected to the control and processing unit, capable of transmitting control information to at least the second part.

3. The device as claimed in claim 1, wherein the network, comprising at least one line, a detection system is coupled with each line end.

4. The device as claimed in claim 1, wherein, the network being made up of a plurality of segments, an i-order segment is seen by a number $n_i$ of detection systems.

5. The device as claimed in claim 1, further comprising means for measuring at least one electrical variable within the network, an opening command being sent to the switch when the measurement of this variable exceeds a given threshold.

6. The device as claimed in claim 5, wherein the variable is the current.

7. The device as claimed in claim 2, wherein the coupling means perform a directive coupling by orienting the signal injected into the line in a given direction.

8. The device as claimed in claim 1, wherein said at least one detection system is programmed to detect impedance changes in a given line area.

9. The device as claimed in claim 1, wherein the signal sent to trigger the opening of a switch is a coded signal, said coded signal being carried by the sensor signal injected by the at least one detection system.

10. The device as claimed in claim 1, wherein the given detection threshold is programmable.

11. The device as claimed in claim 2, wherein at least the injection unit, the receiving unit and the control and data processing unit are shared among a plurality of lines, one or more multiplexers being inserted between the injection unit and the receiving unit and the coupling means belonging to each line.

12. The device as claimed in claim 1, wherein the device is capable of delivering line diagnosis information on the basis of detections of impedance variation or speed variation of a signal injected by the reflectometry detection system.

13. The device as claimed in claim 1, wherein the detection system carries out a multi-carrier reflectometry method.

14. The device as claimed in claim 13, wherein the multi-carrier reflectometry method is MCTDR.

15. A device for protecting electrical networks, comprising:
   at least a first part intended to detect an electrical fault occurring in a network and a second part comprising at least one switch connecting said network to a power supply source, the first part comprising at least one reflectometry detection system capable of being coupled with the network, said reflectometry detection system configured to detect and analyze impedance changes occurring in the network,
   wherein a signal is sent by said system to trigger an opening of the at least one switch when a detected impedance change exceeds a given threshold,
   wherein the first part includes a group of reflectometry detection systems couplable at a plurality of locations of an electrical network, and
   wherein a detection system is coupled at an end of each line in the network.

* * * * *